United States Patent [19]

Arai

[11] 4,013,947
[45] Mar. 22, 1977

[54] CENTRAL COUPLER FOR A CENTRALIZED MONITOR SYSTEM FOR MOTOR VEHICLES

[75] Inventor: Hiroshi Arai, Toyota, Japan

[73] Assignee: Toyota Jidosha Kogyo Kabushiki Kaisha, Toyota, Japan

[22] Filed: Aug. 15, 1975

[21] Appl. No.: 605,215

[30] Foreign Application Priority Data

Jan. 21, 1975 Japan .................................. 50-9410

[52] U.S. Cl. .............................. 324/51; 324/133; 340/52 F; 340/214

[51] Int. Cl.² ...................... G01R 31/02; B60Q 1/00

[58] Field of Search ...................... 324/51, 52, 133; 340/52 F, 66, 74, 79, 80, 214, 251, 252, 411

[56] References Cited

UNITED STATES PATENTS

| | | | |
|---|---|---|---|
| 3,068,449 | 12/1962 | Aloway | 340/252 R X |
| 3,103,808 | 9/1963 | Eichelberger | 324/51 X |
| 3,202,829 | 8/1965 | Kawahara | 340/80 X |
| 3,250,950 | 5/1966 | Reiche | 340/251 X |
| 3,387,260 | 6/1968 | Wood | 340/74 X |
| 3,431,428 | 3/1969 | Van Valer | 324/51 UX |
| 3,566,401 | 2/1971 | Smith et al. | 340/411 |
| 3,593,274 | 7/1971 | Krugler | 340/251 X |
| 3,626,367 | 12/1971 | Howard et al. | 340/52 F |
| 3,852,733 | 12/1974 | Sakurai | 324/51 X |
| 3,899,770 | 8/1975 | Slotkowski | 340/52 F |

Primary Examiner—Gerard R. Strecker
Attorney, Agent, or Firm—Spensley, Horn & Lubitz

[57] ABSTRACT

A centralized monitor system for motor vehicles having abnormality-detecting sensors located differently as applied to vehicle parts or objects to be monitored, switching circuits and warning display lamps, provides a coupling arrangement, in the form of a single multi-connector, between the sensors and switching circuits. Ready inspection of if any switching circuit or display lamp is damaged or in failure is possible simply by disconnecting the single connector.

3 Claims, 4 Drawing Figures

CENTRAL COUPLER FOR A CENTRALIZED MONITOR SYSTEM FOR MOTOR VEHICLES

BACKGROUND OF THE INVENTION

This invention generally relates to a cenralized monitor system for motor vehicles, and more particularly to an improved coupling arrangement between abnormality-detecting sensors and associated switching circuits to be employed in the monitor system.

In motor vehicles such as automobiles, as commonly accepted, it is highly effective for safety assurance that essential parts or objects incorporated in the automobile be monitored of abnormal operating conditions occurring thereat. By way of example, such parts or objects to be monitored include the functionings of various display lamps, battery capacities, quantities of various fluid consumables in store e.g. engine oil, window-water, coolant, etc., and wearings of brake lining elements, etc. In this connection, there has been known a centralized monitor system for automobiles of the type by which a car driver, as seated, may check up instantly those various items to be monitored.

This monitor system usually includes a plurality of monitor channels, each channel having a sensor for detection of abnormalities occurring at a respective part or object to be monitored, a switching circuit connected to the sensor and a warning display means e.g. a lamp connected to the switching circuit. Each sensor to be applied adjacent and in operative association with the respective part or object to be monitored, is usually in the form of a switch of the functional type which is to be made "on" when the object remains normal while being made "off" in response to the occurrence of abnormalities thereat. All the warning display lamps are usually conveniently panelled on an overhead console in the car.

With this arrangement, therefore, if any one part or object to be monitored shows abnormal or prohibitive operating conditions, the respective sensor becomes "off" in position, the switching circuit "on", so that the respective lamp is lit up to draw the attention of a car driver on that problem part or object.

However, this ordinary monitor system has had the problem in checking up if or not the switching circuits and lamps are damaged or fail. Namely, such checking procedure is that all of the individual sensors located differently within the vehicle structure are disconnected from the respective switching circuits so that the switching circuits now assume "on" positions as if they normally did so when the sensor was made "off" in response to the occurrence of abnormalities. If any warning display lamp still then is not lit up, it will be obvious that either a switching circuit or lamp in that monitor channel is damaged or fails. This procedure has been very troublesome and time-consuming because of the sensors being so differently located in the vehicle structure, despite the fact that frequent inspection of electric circuits or parts is very important to the monitor system.

SUMMARY OF THE INVENTION

The invention, therefore, aims to overcome this prior art problem by providing a centralized monitor system for motor vehicles featured by an improved coupling arrangement between abnormality-detecting sensors and associated switching circuits which assures easy, instant finding of damages or failures possibly occurring in the switching circuits including display lamps.

According to the invention, there is provided a centralized monitor system for motor vehicles comprising a plurality of abnormality-detecting sensors disposed as applied to respective vehicle parts or objects to be monitored, each sensor being in the form of a switch of the functional type which is made "on" when said object is normal in the operating condition and "off" when the object shows abnormalities, a corresponding plurality of switching circuits each of which is made "off" and "on" in response to the "on" and "off" positions assumed by the associated sensor, respectively, and a corresponding plurality of warning display means connected to said respective switching circuits, characterized by that said switching cicuits and sensors are interconnected by a single group arrangement of terminals.

The invention wll now be described with reference to the accompanying drawings.

DESCRIPTION OF THE PREFERRED EMBODIMENTS

Figure 1:
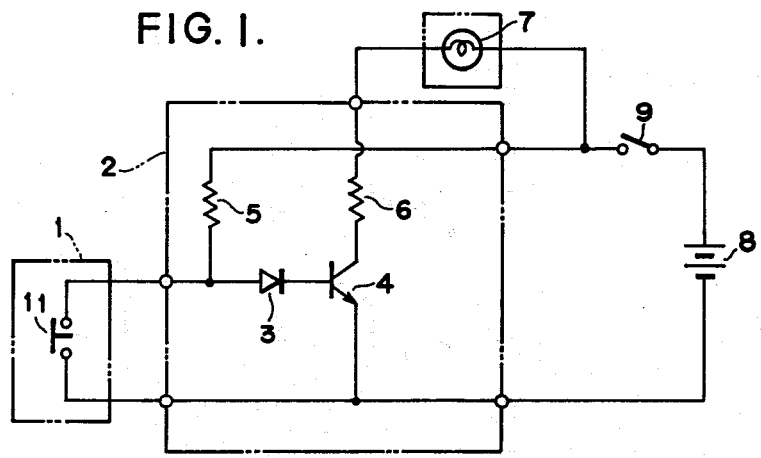
FIG. 1 is circuit diagram of a single monitor channel showing the concept of a centralized monitor system for motor vehicles.
Figure 2:
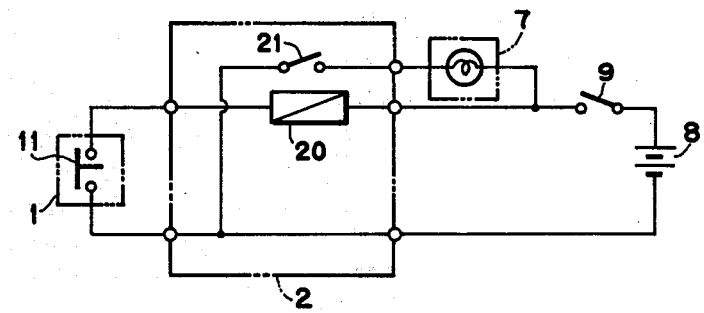
FIG. 2 is a further circuit diagram of the same.

FIGS. 1 and 2 respectively show circuit diagrams of a single monitor channel representing the concept of an ordinary centralized monitor system for motor vehicles. In FIG. 1, an abnormality-detecting sensor 1 comprises a switch 11 which is disposed adjacent or applied to a vehicle part or object to be monitored. This switch is adapted to close or is made "on" when the object is normal in operating conditions, and open or is made "off" in response to the occurrence of abnormalities thereat. The "on" and "off" signals from the sensor are sent to a switching circuit 2, which comprises a diode 3, transistor 4 and resistors 5, 6, so that the transistor 4 is made "off" when the switch is "on" and made "on" when the switch is "off". Accordingly, upon the transistor 4 being made "on", a warning display lamp 7 connected to the collector of the transistor 4 and to a power source 8 via a key ignition switch 9, will be lit up for warning indication of abnormalities detected out by the sensor 1.

FIG. 2 shows a further arrangement of a single monitor channel wherein the switching circuit 2 comprises a relay coil 20 and relay contact 21. In this arrangement, when the relay coil 20 is deenergized in response to the "off" position assumed by the sensor 1, the contact 21 is closed to light up the warning display lamp 7.

In either arrangement, if the sensor is disconnected from the switching circuit, then the result will be that the switching circuit is made "on" as if it normally was made so when the sensor was "off" in response to the occurrence of abnormalities. From this principle, the necessary step of checking if the switching circuit and warning display lamp are damaged or fail is taken in a manner that the sensor is once disconnected from the switching circuit then to see if the warning lamp is lit up or not. However, with the ordinary monitor system consisting of a plurality of monitor channels, it has been troublesome and time-consuming to disconnect individual sensors located differently within the vehicle structure from the respective switching circuits.

Figure 3:
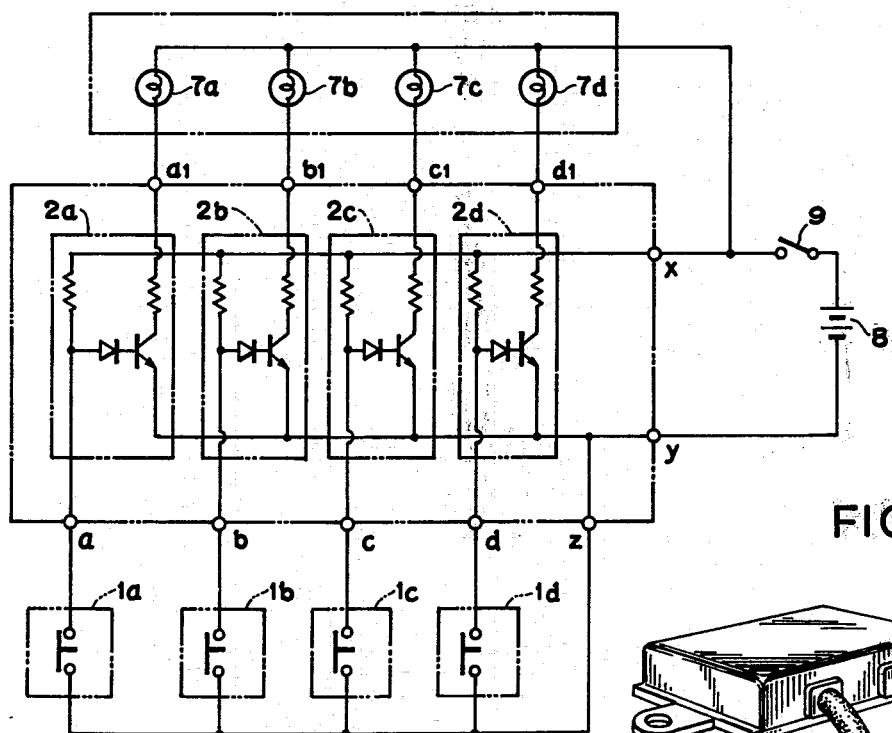
FIG. 3 is a circuit diagram of a centralized monitor system according to the invention.
Figure 4:
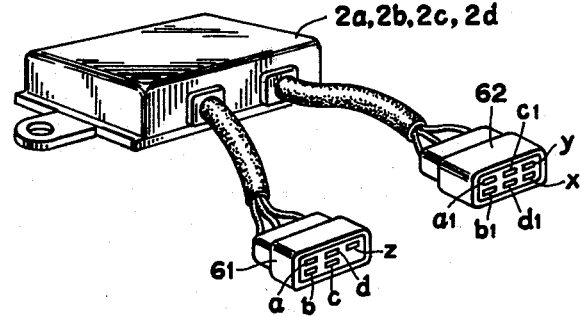
FIG. 4 is a schematic view showing how the coupling arrangement of the invention is practiced.

FIG. 3 shows a circuit diagram of a centralized monitor system having an improved coupling arrangement according to the invention. As shown, the system comprises a plurality of sensors, or four sensors for example in the illustrated case, 1a, 1b, 1c, 1d, four switching circuits 2a, 2b, 2c, 2d, and four warning display lamps 7a, 7b, 7c, 7d, thus serving to monitor four different problem parts or objects involved in the vehicle. The sensors 1a, 1b, 1c, 1d are connected to the switching circuits 2a, 2b, 2c, 2d through a group of connecting terminals a, b, c, d, z to be arranged in the form of a single multi-connector. Further groups of connecting terminals a1, b1, c1, d1, and x, y for connection between the switching circuits and warning display lamps, and of the power source 8, respectively, are also in the form of a single multi-connector. This coupling arrangement is illustrated for example of practice in FIG. 4, wherein a single connector 61 having collective terminals a, b, c, d, z is led from the switching circuits 2a, 2b, 2c, 2d. A further connector 62 having terminals a, b, c, d, x, y is also connected to the switching circuits. It is to be noted, of course, that the connectors of the socket type 61 and 62 are to cooperate with respective connectors of the plug type which have been omitted in FIG. 4.

According to the coupling arrangement of the invention, therefore, it is made possible to check, on all monitor channels, if or not the switching circuits are damaged or in failure simply by disconnecting the connector 61 only once. Namely, if any lamp is not lit up after having disconnected the connector 61, it will tell that either switching circuit or lamp in that monitor channel is damaged or in failure, otherwise the switching circuits are proved all right. The invention thus may contribute much to instant, easy inspection or maintenance of the monitor system hence safety assurance in operation of the vehicle.

What is claimed is:

1. A central coupler for a monitor system for motor vehicles of the type including a plurality of abnormality-detecting sensors disposed as applied to respective vehicle parts or objects to be monitored, each sensor being in the form of a switch of the functional type which is made on when the respective object is normal in the operating condition and off when the object shows abnormalities, and a corresponding plurality of warning display means, said central coupler comprising:
    a housing;
    a plurality of switching circuits accommodated in said housing each of which is made off and on in response to the on and off positions assumed by the associated sensor, each of said switching circuits also controlling an associated one of said warning display means; and
    at least two multi-terminal connectors external to said housing, a first one of said connectors electrically coupling said plurality sensors to said switching circuits and a second one of said connectors electrically coupling said switching circuits to a source of D.C. power and further connecting said swiching circuits to said display means such that the operation of said switching circuits and said display means may be tested by disconnecting said first one of said connectors from said sensors, whereby a malfunction of either a switching circuit or a display means is indicated by a failure of said monitor system to give a warning.

2. A central coupler for a monitor system for motor vehicles according to claim 1 wherein each of said sensors comprises a normally closed switch.

3. A central coupler for a monitor system for motor vehicles according to claim 2 wherein each of said plurality of switching circuits comprises a transistor having its emitter coupled to one pole of said source of DC power and its collector coupled to its associated one of said warning display means via a resistor and further having its base coupled to said normally open sensor switch via a diode and to the other pole of said source of DC power via a second resistor.

* * * * *